United States Patent

Nishioka

[11] Patent Number: 5,973,911
[45] Date of Patent: Oct. 26, 1999

[54] FERROELECTRIC THIN-FILM CAPACITOR

[75] Inventor: Yasushiro Nishioka, Tsukuba, Japan

[73] Assignee: Texas Instruments Incorporated, Dallas, Tex.

[21] Appl. No.: 08/851,053

[22] Filed: May 5, 1997

Related U.S. Application Data

[63] Continuation of application No. 08/508,941, Jul. 28, 1995, abandoned.

[30] Foreign Application Priority Data

Jul. 29, 1994 [JP] Japan .................................. 6-178819

[51] Int. Cl.$^6$ ..................................... H01G 4/06
[52] U.S. Cl. ...................... 361/313; 361/321.5; 257/295; 252/520
[58] Field of Search ..................... 361/303, 305, 361/306.3, 311, 313, 321.5; 257/295, 296; 438/239, 240, 244; 29/25.42; 252/520

[56] References Cited

U.S. PATENT DOCUMENTS

| 5,122,477 | 6/1992 | Wolters et al. ........................... 437/60 |
| 5,443,030 | 8/1995 | Ishihara et al. ............................. 117/8 |
| 5,512,538 | 4/1996 | Den et al. .................................. 505/126 |
| 5,548,475 | 8/1996 | Ushikubo et al. ...................... 361/321.4 |

*Primary Examiner*—Kristine Kincaid
*Assistant Examiner*—Anthony Dinkins
*Attorney, Agent, or Firm*—William B. Kempler; Richard L. Donaldson

[57] ABSTRACT

A method for making a ferroelectric thin film capacitor. A Ti adhesive layer is formed on a silicon substrate covered with a silicon oxide layer. On this, a Pt film is deposited as a lower capacitor electrode, over which a ferroelectric film of high permittivity, such a crystallized BST film, is deposited by sputtering. Then an upper Pt electrode is deposited over the BST film by sputtering to form a capacitor. Finally, the capacitor is heat-treated in an oxidizing atmosphere to eliminate any leakage holes, that cause leakage current, in the ferroelectric thin film caused by the sputtering.

5 Claims, 3 Drawing Sheets

FERROELECTRIC THIN-FILM CAPACITOR

This application is a Continuation, of application Ser. No. 08/508,941, filed Jul. 28, 1995 now abandoned.

FIELD OF THE INVENTION

This invention relates to methods for making semiconductor devices, and more particularly to a method for making a ferroelectric thin-film capacitor with small leakage current and high yield.

BACKGROUND OF THE INVENTION

Along with the high integration of semiconductor devices, the miniaturization of their components has also advanced. For a dynamic random access memory (DRAM), a high-capacity capacitor of very small area is required. Ferroelectric thin films with extremely large relative permittivity have attracted consideration for making such capacitors. As a well-known example, the work of P. J. Bhattacharya et al. is mentioned in Japan J. Appl. Phys., Vol. 32 (1993), pp. 4103–4106.

Bhattacharya et al. understood that when a $(Ba, Sr)TiO_3$ (hereafter "BST") film was formed on a Pt substrate, the crystals of the film grew in a columnar shape, enabling a high relative permittivity of 300 to be achieved. However, when capacitors were made using this thin film, there were many with a large leakage current and short-circuits in the initial stage, so it was difficult to use them for ultra large scale integration (ULSI) such as DRAM. As a result of reviewing such problems in detail, it became understood that the process for forming an upper electrode was related. When capacitors are formed using these thin films, metallic materials such as Pt are often deposited on the film as an upper electrode by sputtering, electron-beam vapor deposition, etc.

When the upper electrode was formed by these methods, a leakage current was generated through the dielectric film, and it was difficult to use dielectric as a capacitor for DRAM. Accordingly, one object of the invention is to provide a method for making a ferroelectric thin film capacitor in which leakage current is kept small even if the upper electrode is deposited on the ferroelectric dielectric film by sputtering or electron-beam vapor deposition.

SUMMARY OF THE INVENTION

A method for making a ferroelectric thin film capacitor. A Ti adhesive layer is formed on a silicon substrate covered with a silicon oxide layer. On this, a Pt film is deposited as a lower capacitor electrode, over which a ferroelectric film of high permittivity, such a crystallized BST film, is deposited by sputtering. Then an upper Pt electrode is deposited over the BST film by sputtering to form a capacitor. Finally, to eliminate any oxygen holes in the ferroelectric thin film caused by the sputtering, the capacitor is heat-treated in an oxidizing atmosphere.

In the figures, 1 is an oxidized Si substrate, 2 is a silicon oxide, 3 is a Ti film, 4 is a Pt film (lower electrode), 5 is a crystal BST film, 6 is a Pt film (upper electrode), 7 is an oxygen hole, 8 is an oxygen atom, and 9 is a PZT film.

DESCRIPTION OF EMBODIMENTS

Embodiment 1

Figure 1A:
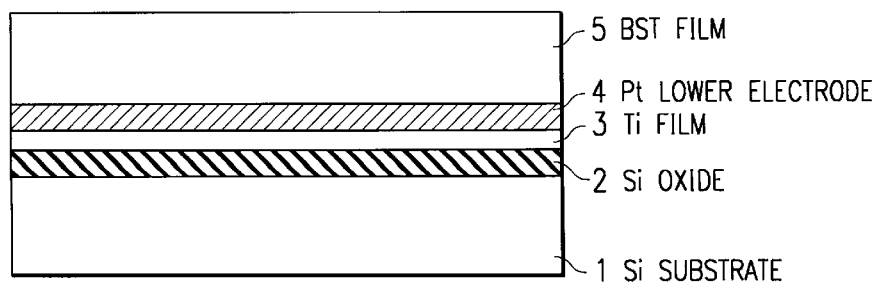
FIGS. 1(a) and 1(b) are cross sections showing a process for making a ferroelectric (BST) capacitor according to a first embodiment of the invention.

As shown in FIG. 1(a), a Ti film 3 of about 50 nm is formed as an adhesive layer by sputtering on a silicon substrate 1 covered with a silicon oxide layer 2. On this, a 200 nm thick Pt film 4 is formed as a lower capacitor electrode by sputtering. An insulating BST film 5 about 200 nm thick is then deposited by sputtering using a BST ceramic target in an $O_2/Ar$ gas mixture. During formation the substrate temperature is about 650° C., so a crystallized BST film 5 is grown. The crystallized BST film has a relative permittivity as large as about 300, so compared with conventional silicon oxide film having a small relative permittivity of 3.9, it is advantageous for building a capacitor with a small area.

Figure 1B:
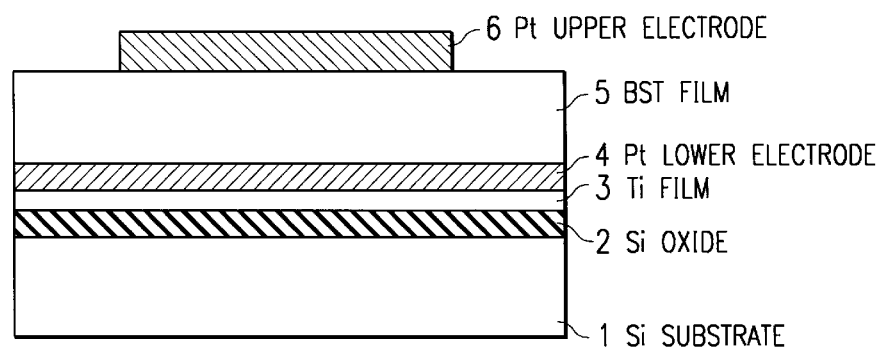

Finally, as shown in FIG. 1(b), an upper Pt electrode 6 is deposited on top of the BST film by sputtering to form a capacitor. When the capacitor's electrical characteristics were evaluated, the crystal BST film was found to have a large leakage current, so it was realized that it could not retain the electric charges necessary for memory operation as a capacitor for DRAM.

Figure 2:
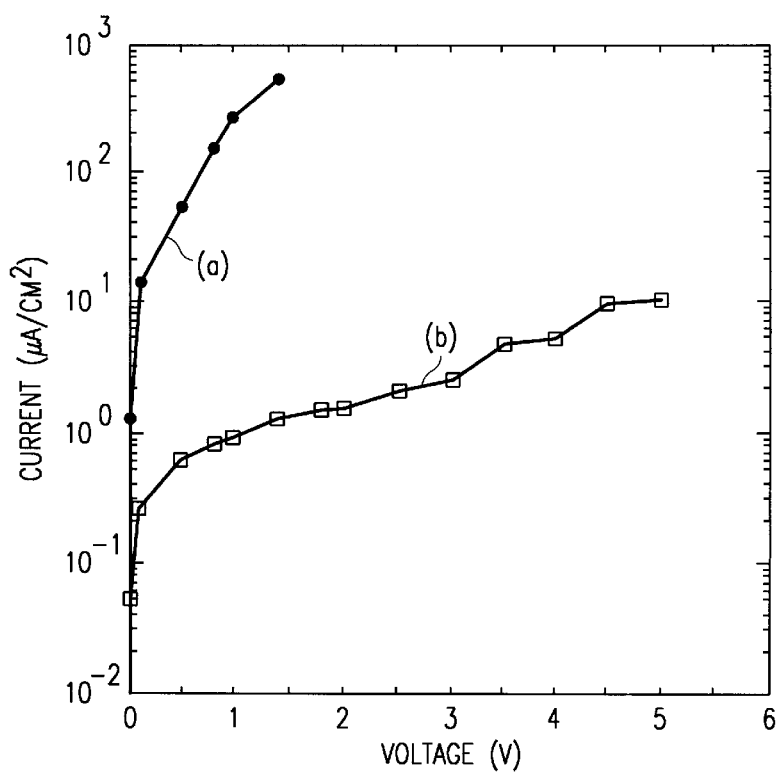
FIG. 2 is a graph of the current-voltage characteristics of (a) a BST capacitor measured immediately after forming an upper Pt electrode in a conventional manner and (b) an improved BST capacitor that has been annealed in oxygen according to the first embodiment of the invention.

In FIG. 2, curve (a) shows the current-voltage characteristics of the capacitor formed by the steps illustrated in FIGS. 1(a) and 1(b). After much trial and error directed to reducing the large leakage current, it was discovered that when the leaky capacitor of FIG. 1(b) is heat-treated for about 30 minutes in oxygen at about 500° C., an improved capacitor of low leakage current, as shown in current-voltage curve (b) of FIG. 2.

Figure 3:
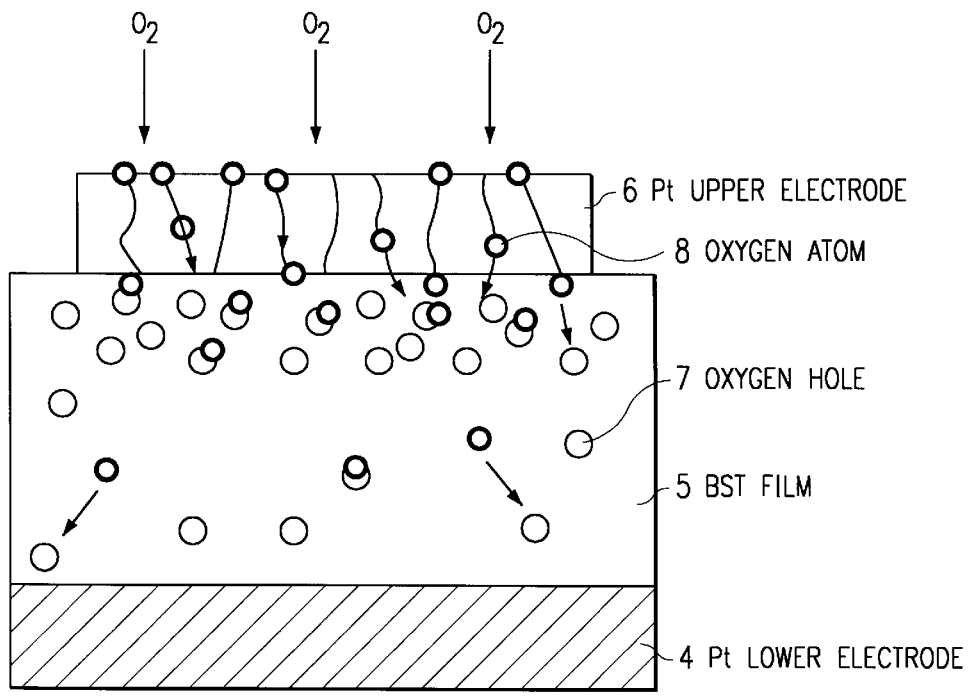
FIG. 3 is a cross section of a model of a BST capacitor used to explain the invention.

From these experiments, a model to understand the problem and its solution was devised as shown in FIG. 3. When BST film 5 is first formed, it has relatively few leakage holes in it which can cause leakage current, such as oxygen holes 7. But when upper Pt electrode 6 is deposited by sputtering on the upper surface of BST film 5, the associated plasma, electron beams, and ultraviolet rays generate many more leakage holes, such as oxygen holes 7, near the surface of BST film 5. The many oxygen holes 7 present in this region raise the electrical conductivity, increasing the capacitor's leakage current. Therefore, it was thought that when the structure of FIG. 3 is annealed in oxygen, the leakage holes, such oxygen holes 7, will be extinguished by the oxygen atoms and molecules.

As shown in FIG. 3, oxygen molecules $O_2$ decompose on the surface of Pt electrode 6 and diffuse through the electrode's crystal grain boundaries. As the decomposed oxygen combines with the oxygen holes 7 in the BST film 5, the film approaches becoming a perfectly structured BST film. In particular, this oxygen annealing eliminates oxygen holes generated near the interface of the Pt electrode 6 and the BST film 5 when the Pt electrode was formed, which explains the reduction in leakage current shown in FIG. 2(b).

Embodiment 2

Figure 4A:
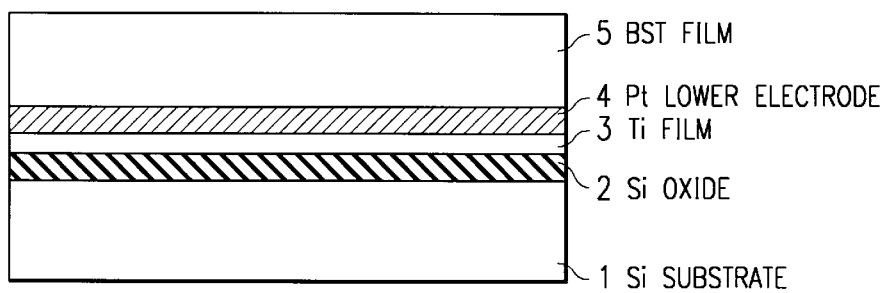
FIGS. 4(a) and 4(b) are cross sections showing a process for making a ferroelectric (BST) capacitor according to a second embodiment of the invention.

As suggested from the model discussed above, in a second embodiment the leakage current was further decreased by oxygen annealing both just before and after forming the upper Pt electrode 6. As shown in FIG. 4(a), a Ti film 3 of about 50 nm is formed as an adhesive layer by sputtering on a silicon substrate 1 covered with a silicon oxide layer 2. On this, a 200 nm thick Pt film 4 is formed as a lower capacitor electrode by sputtering. An insulating BST film 5 about 200 nm thick is then deposited by sputtering using a BST ceramic target in an $O_2$/Ar gas mixture. During formation the substrate temperature is about 650° C., so a crystallized BST film 5 is grown.

Figure 4B:
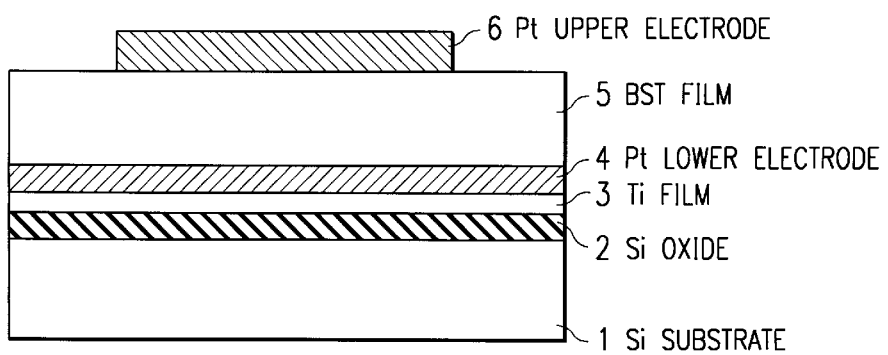
Figure 5:
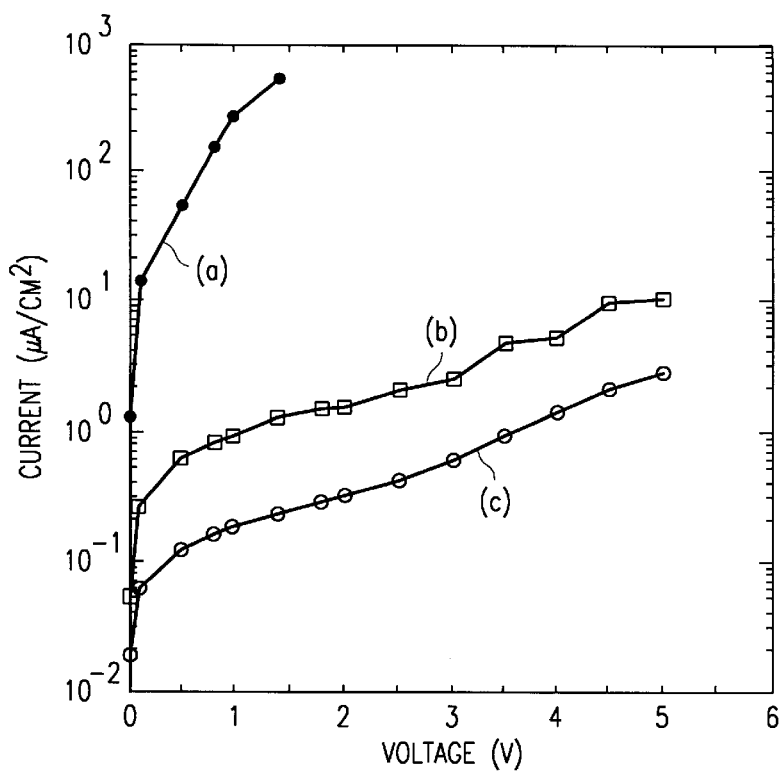
FIG. 5 is a current-voltage graph comparing the characteristics of (a) a BST capacitor measured immediately after forming an upper Pt electrode in the conventional manner (b) an improved BST capacitor that has been annealed once in oxygen according to the second embodiment of the invention, and (c) a BST capacitor that has been annealed in oxygen both before and after depositing an upper Pt electrode.

Then the structure formed so far is annealed at 650° C. for about 10 min in an oxygen atmosphere. Next, as shown in FIG. 4(b), an upper Pt electrode 6 is formed on top of the BST film by sputtering to form a capacitor. Thereafter, the capacitor was heat-treated for about 30 min in oxygen at about 500° C., resulting in a capacitor with very low leakage current as shown by current-voltage curve (c) of FIG. 5. For comparison, FIG. 5 also shows the current-voltage curves of (a) a high leakage capacitor made without annealing, and (b) a capacitor only annealed after depositing the upper electrode.

Embodiment 3

Figure 6A:
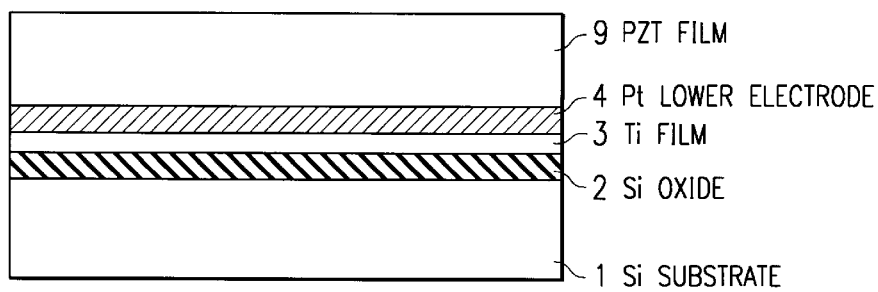
FIGS. 6(a) and 6(b) are cross sections of a process for making a PZT ferroelectric capacitor according to a third embodiment of the invention.

Effects similar to the previous embodiments were observed even when using a crystallized Pb(Zr, Ti)$O_3$ film (PZT) as a dielectric for the capacitor. As shown in FIG. 6(a), a Ti film 3 of about 50 nm is formed as an adhesive layer by sputtering on a silicon substrate 1 covered with a silicon oxide layer 2. On this, a 200 nm thick Pt film 4 is formed as a lower capacitor electrode by sputtering. A crystallized PZT film 9 is then deposited on Pt lower electrode 4 by the sol-gel method. In this process, an inorganic metal such as Pb, Zr, and Ti is dissolved in an organic solvent, sampled by the spin coating method, etc., and deposited at a film thickness of about 200 nm on Pt lower electrode 4. Next, the organic solvent and moisture are removed by baking the structure made so far at a temperature of about 150° C. Then the structure is heat-treated in oxygen at 650° C. to crystallize the amorphous film.

Figure 6B:
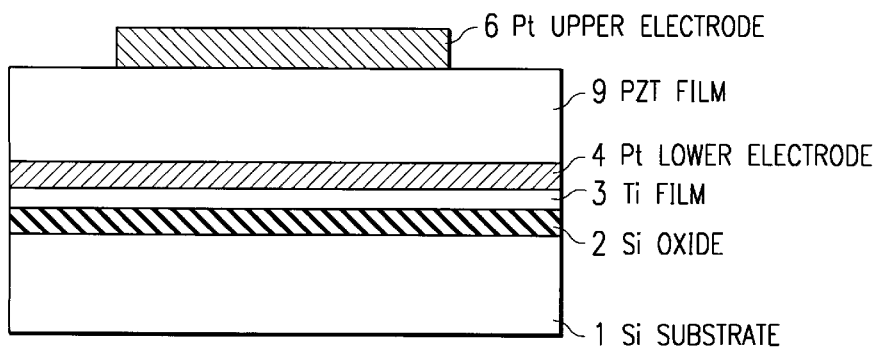

Thereafter, as shown in FIG. 6(b), the Pt upper electrode 6 is deposited by sputtering to form a capacitor. The capacitor is then heat-treated for about 30 min in oxygen at about 500° C. This method produces a capacitor with very low leakage current. The relative permittivity of PZT film can even be about 1000, so a capacitor with a smaller area and a larger capacity can be formed, compared with when BST film is used. Even when PZT film is used, when oxygen annealing is carried out before forming the upper Pt electrode 6, a reduction of the leakage current similar to that of Embodiment 2 was seen.

In the embodiments, the effect of the invention was explained with the upper electrode formed by sputtering. However, a similar improvement was found even when the upper electrode is deposited by electron-beam vapor deposition or thermal vapor deposition. An annealing method for curing oxygen defects in the insulating layer was explained using annealing in oxygen as an example. However, a marked effect is obtained even by ozone $O_3$ treatment and ozone $O_3$ treatment in ultraviolet rays.

The concept of the invention also applies to other ferroelectric materials besides BST and PZT. The ferroelectric thin film in the invention may also include $SrTiO_3$, $BaTiO_3$, (Pb, La) (Zr, Ti)$O_3$, Pb(Zr, Ti)$O_3$, $PbTiO_3$, etc., as a component.

The sputtering method and sol-gel method were explained as examples of methods for growing ferroelectric thin films. However, the CVD method, MOD method, etc., may also be used for the growth process.

Pt film was explained as an example for the upper electrode material. However, Pd, Pd—Pt alloy, indium Ir and its oxide, ruthenium oxide RuO, etc., may also be used as electrodes of the ferroelectric capacitor.

I claim:

1. A ferroelectric thin-film capacitor, comprising:
   a silicon substrate;
   an $SiO_2$ film formed on the silicon substrate;
   a Ti film formed as an adhesive layer on the $SiO_2$ film;
   a lower electrode formed on the Ti film;
   a thin, annealed BST ferroelectric insulating film, having upper and lower surfaces, disposed adjacent and above the lower electrode; and
   an upper electrode of a conducting material formed on the upper surface of the insulating film after the insulating film has been annealed in an oxidizing atmosphere, by:
   depositing the conducting material on the upper surface of the insulating film so as to substantially introduce leakage holes, that cause leakage current, in the insulating film, and
   heat-treating the insulating film in an oxidizing atmosphere to eliminate the leakage holes.

2. The capacitor of claim 1 wherein the conducting material is deposited by sputtering.

3. The capacitor of claim 1 wherein the conducting material is deposited by electron-bean vapor deposition.

4. The capacitor of claim 1 wherein the upper electrode is formed on the insulating film by sputtering.

5. The method of claim 1 wherein the upper electrode is formed on the insulating film by vapor deposition.

* * * * *